(12) United States Patent
Wu et al.

(10) Patent No.: US 7,429,427 B2
(45) Date of Patent: Sep. 30, 2008

(54) GRANULAR MAGNETIC RECORDING MEDIA WITH IMPROVED GRAIN SEGREGATION AND CORROSION RESISTANCE

(75) Inventors: Zhong (Stella) Wu, Fremont, CA (US); Samuel Dacke Harkness, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 411 days.

(21) Appl. No.: 11/003,519

(22) Filed: Dec. 6, 2004

(65) Prior Publication Data

US 2006/0121319 A1   Jun. 8, 2006

(51) Int. Cl.
 *G11B 5/65* (2006.01)

(52) U.S. Cl. .................. 428/836.2; 428/836.3

(58) Field of Classification Search ........................ None
See application file for complete search history.

(56) References Cited

U.S. PATENT DOCUMENTS

| | | | |
|---|---|---|---|
| 4,013,534 A | 3/1977 | Ishii et al. | |
| 4,713,262 A | 12/1987 | Yasunaga et al. | |
| 5,262,388 A | 11/1993 | Munro et al. | |
| 5,368,932 A | 11/1994 | Murooka et al. | |
| 5,516,547 A | 5/1996 | Shimizu et al. | |
| 5,652,054 A * | 7/1997 | Kikitsu et al. | 428/328 |
| 5,658,680 A | 8/1997 | Shimizu et al. | |
| 5,736,013 A * | 4/1998 | Ranjan et al. | 204/192.2 |
| 5,965,194 A | 10/1999 | Truong et al. | |
| 6,136,428 A | 10/2000 | Truong et al. | |
| 6,251,474 B1 | 6/2001 | Hong et al. | |
| 6,599,608 B2 | 7/2003 | Hong et al. | |
| 6,667,116 B1 * | 12/2003 | Uwazumi et al. | 428/832 |
| 6,680,106 B1 | 1/2004 | Thangaraj et al. | |
| 6,696,172 B2 * | 2/2004 | Oikawa et al. | 428/831 |
| 6,716,543 B2 * | 4/2004 | Uwazumi et al. | 428/828 |
| 6,723,450 B2 * | 4/2004 | Do et al. | 428/828 |
| 6,899,964 B2 * | 5/2005 | Nakamura et al. | 428/832.1 |
| 7,105,240 B2 * | 9/2006 | Wu et al. | 428/832.1 |
| 7,192,664 B1 * | 3/2007 | Wu et al. | 428/836.2 |
| 2003/0138671 A1 * | 7/2003 | Oikawa et al. | 428/695 |
| 2003/0219629 A1 * | 11/2003 | Moriwaki et al. | 428/694 R |
| 2003/0219630 A1 * | 11/2003 | Moriwaki et al. | 428/694 R |
| 2004/0151949 A1 * | 8/2004 | Oikawa et al. | 428/694 TM |
| 2004/0166376 A1 * | 8/2004 | Kirino et al. | 428/694 TM |
| 2004/0229084 A1 * | 11/2004 | Oikawa et al. | 428/694 BH |
| 2004/0247940 A1 * | 12/2004 | Chang et al. | 428/694 T |
| 2005/0098426 A1 * | 5/2005 | Ranjan et al. | 204/192.2 |
| 2005/0100764 A1 * | 5/2005 | Ranjan et al. | 428/694 TM |

FOREIGN PATENT DOCUMENTS

JP   2004-272958 A * 9/2004

OTHER PUBLICATIONS

JPO Abstract translation of JP 2004-272958 A.*

* cited by examiner

*Primary Examiner*—Kevin M Bernatz
(74) *Attorney, Agent, or Firm*—McDermott Will & Emery LLP

(57) ABSTRACT

Disclosed are granular magnetic recording media with improved grain segregation and corrosion resistance, comprising a non-magnetic substrate and at least one granular magnetic recording layer formed over the surface, comprised of at least one ferromagnetic material including magnetic grains with grain boundaries and a non-magnetic material comprised of a mixture of metal oxides. Also disclosed are methods for fabricating the improved media.

13 Claims, 1 Drawing Sheet

GRANULAR MAGNETIC RECORDING MEDIA WITH IMPROVED GRAIN SEGREGATION AND CORROSION RESISTANCE

FIELD OF THE INVENTION

The present invention relates to methods for fabricating thin film granular magnetic recording media with improved grain segregation and corrosion resistance and to improved magnetic recording media obtained thereby. The invention has particular utility in the manufacture of high and ultra-high areal recording density media, e.g., hard disks, utilizing granular-type magnetic recording layers.

BACKGROUND OF THE INVENTION

Magnetic media are widely used in various applications, particularly in the computer industry for data/information storage and retrieval applications, typically in disk form, and efforts are continually made with the aim of increasing the areal recording density, i.e., bit density of the magnetic media. Conventional thin film thin-film type magnetic media, wherein a fine-grained polycrystalline magnetic alloy layer serves as the active recording layer, are generally classified as "longitudinal" or "perpendicular", depending upon the orientation of the magnetic domains of the grains of magnetic material.

Perpendicular recording media have been found to be superior to longitudinal media in achieving very high bit densities without experiencing the thermal stability limit associated with the latter. In perpendicular magnetic recording media, residual magnetization is formed in a direction ("easy axis") perpendicular to the surface of the magnetic medium, typically a layer of a magnetic material on a suitable substrate. Very high to ultra-high linear recording densities are obtainable by utilizing a "single-pole" magnetic transducer or "head" with such perpendicular magnetic media.

Efficient, high bit density recording utilizing a perpendicular magnetic medium requires interposition of a relatively thick (as compared with the magnetic recording layer), magnetically "soft" underlayer ("SUL"), i.e., a magnetic layer having a relatively low coercivity below about 1 kOe, such as of a NiFe alloy (Permalloy), between the non-magnetic substrate, e.g., of glass, aluminum (Al) or an Al-based alloy, and the magnetically "hard" recording layer having relatively high coercivity, typically about 3-8 kOe, e.g., of a cobalt-based alloy (e.g., a Co—Cr alloy such as CoCrPtB) having perpendicular anisotropy. The magnetically soft underlayer serves to guide magnetic flux emanating from the head through the magnetically hard perpendicular recording layer.

A typical conventional perpendicular recording system 20 utilizing a vertically oriented magnetic medium 21 with a relatively thick soft magnetic underlayer, a relatively thin hard magnetic recording layer, and a transducer head 16, is illustrated in FIG. 1, wherein reference numerals 10, 11, 4, 5, and 6, respectively, indicate a non-magnetic substrate, an optional adhesion layer, a soft magnetic underlayer, at least one non-magnetic seed or underlayer (sometimes referred to as an "intermediate" layer or as an "interlayer"), and at least one magnetically hard perpendicular recording layer with its magnetic easy axis perpendicular to the film plane. Preferably, the various underlayers should establish a high surface roughness in order to induce grain separation in the magnetic recording layer.

Still referring to FIG. 1, reference numerals 7 and 8, respectively, indicate the main and auxiliary poles of a magnetic transducer head 16. The relatively thin interlayer 5, comprised of one or more layers of non-magnetic materials, serves to (1) prevent magnetic interaction between the soft underlayer 4 and the at least one hard recording layer 6; (2) promote desired microstructural and magnetic properties of the at least one magnetically hard recording layer, e.g., by serving to establish a crystallographically oriented base layer for inducing growth of a desired plane in the overlying perpendicular magnetically hard recording film or layer (e.g., a <0002> hcp plane); and (3) establish a high surface roughness in order to induce grain separation in the magnetically hard recording layer.

As shown by the arrows in the figure indicating the path of the magnetic flux $\phi$, flux $\phi$ is seen as emanating from the main (writing) pole 7 of transducer head 16, entering and passing through the at least one vertically oriented, magnetically hard recording layer 5 in the region below main pole 7, entering and traveling within soft magnetic underlayer (SUL) 3 for a distance, and then exiting therefrom and passing through the at least one perpendicular hard magnetic recording layer 6 in the region below auxiliary pole 8 of transducer head 16. The direction of movement of perpendicular magnetic medium 21 past transducer head 16 is indicated in the figure by the arrow above medium 21.

With continued reference to FIG. 1, vertical lines 9 indicate grain boundaries of polycrystalline layers 5 and 6 of the layer stack constituting medium 21. Magnetically hard main recording layer 6 is formed on interlayer 5, and while the grains of each polycrystalline layer may be of differing widths (as measured in a horizontal direction) represented by a grain size distribution, they are generally in vertical registry (i.e., vertically "correlated" or aligned).

Completing the layer stack is a protective overcoat layer 14, such as of a diamond-like carbon (DLC), formed over hard magnetic layer 6, and a lubricant topcoat layer 15, such as of a perfluoropolyether material, formed over the protective overcoat layer.

Substrate 10 is typically disk-shaped and comprised of a non-magnetic metal or alloy, e.g., Al or an Al-based alloy, such as Al—Mg having an Ni—P plating layer on the deposition surface thereof, or alternatively substrate 10 is comprised of a suitable glass, ceramic, glass-ceramic, polymeric material, or a composite or laminate of these materials. Optional adhesion layer 11, if present, may comprise an up to about 100 Å thick layer of a material such as Ti, a Ti-based alloy, Cr, or a Cr-based alloy. Soft magnetic underlayer 4 is typically comprised of an about 500 to about 4,000 Å thick layer of a soft magnetic material selected from the group consisting of Ni, NiFe (Permalloy), Co, CoZr, CoZrCr, CoZrNb, CoFeZrNb, CoFe, Fe, FeN, FeSiAl, FeSiAlN, FeCoB, FeCoC, etc. Interlayer 5 typically comprises an up to about 300 Å thick layer or layers of non-magnetic material(s), such as Ru, TiCr, Ru/CoCr$_{37}$Pt$_6$, RuCr/CoCrPt, etc.; and the at least one magnetically hard perpendicular recording layer 6 is typically comprised of an about 50 to about 250 Å thick layer(s) of Co-based alloy(s) including one or more elements selected from the group consisting of Cr, Fe, Ta, Ni, Mo, Pt, V, Nb, Ge, B, and Pd.

A currently employed way of classifying magnetic recording media is on the basis by which the magnetic grains of the recording layer are mutually separated, i.e., segregated, in order to physically and magnetically de-couple the grains and provide improved media performance characteristics. According to this classification scheme, magnetic media with Co-based alloy magnetic recording layers (e.g., CoCr alloys) are classified into two distinct types: (1) a first type, wherein segregation of the grains occurs by diffusion of Cr atoms of the magnetic layer to the grain boundaries of the layer to form Cr-rich grain boundaries, which diffusion process requires heating of the media substrate during formation (deposition) of the magnetic layer; and (2) a second type, wherein segregation of the grains occurs by formation of oxides, nitrides, and/or carbides at the boundaries between adjacent magnetic grains to form so-called "granular" media, which oxides, nitrides, and/or carbides may be formed by introducing a minor amount of at least one reactive gas containing oxygen, nitrogen, and/or carbon atoms (e.g. $O_2$, $N_2$, $CO_2$, etc.) to the inert gas (e.g., Ar) atmosphere during sputter deposition of the Co alloy-based magnetic layer. The latter process does not require substrate heating to an elevated temperature.

Magnetic recording media with granular magnetic recording layers possess great potential for achieving very high and ultra-high areal recording densities. As indicated above, current methodology for manufacturing granular-type magnetic recording media involves reactive sputtering of the magnetic recording layer in a reactive gas-containing atmosphere, e.g., an $O_2$ atmosphere or an atmosphere comprising an oxygen-containing gas compound, in order to incorporate oxides therein and achieve smaller and more isolated magnetic grains. However, magnetic recording media formed in this manner incur a disadvantage in that the granular magnetic recording layers have a porous structure attributed to the aforementioned high roughness induced therein by the underlayer(s) and the high pressure sputter deposition process, resulting in sub-optimal grain segregation and corrosion resistance. In point of fact, corrosion and environmental testing of granular recording media indicate very poor resistance to corrosion and environmental influences and even relatively thick carbon-based protective overcoats, e.g., ~40 Å thick, provide inadequate resistance to corrosion and environmental attack.

In view of the foregoing, there exists a clear need for methodology enabling the manufacture of high and ultra-high areal recording density, high performance granular-type longitudinal and perpendicular magnetic recording media with improved grain segregation and corrosion resistance, which methodology is fully compatible with the requirements of high product throughput, cost-effective, automated manufacture of such media.

The present invention addresses and solves the above-described problems, drawbacks, and disadvantages associated with the above-described conventional methodology for the manufacture of high performance magnetic recording media comprising granular-type magnetic recording layers, while maintaining magnetic properties requisite for high and ultra-high areal density magnetic recording. In addition, the present invention maintains full compatibility with all aspects of automated manufacture of such media.

DISCLOSURE OF THE INVENTION

An advantage of the present invention is improved methods of manufacturing granular magnetic recording media with enhanced grain segregation and improved corrosion and environmental resistance.

Another advantage of the present invention is improved granular magnetic recording media with enhanced grain segregation and corrosion and environmental resistance.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by an improved method of manufacturing granular magnetic recording media, comprising sequential steps of:

(a) providing a non-magnetic substrate including a surface; and (b) forming over the substrate at least one granular magnetic recording layer comprising:
  (i) at least one ferromagnetic material including magnetic grains with grain boundaries; and
  (ii) a non-magnetic material for improving segregation of the magnetic grains, the non-magnetic material comprising a mixture of metal oxides.

According to embodiments of the present invention, step (b) comprises forming at least one granular magnetic recording layer for a perpendicular-type medium, wherein the easy axis of magnetization of the magnetic grains is oriented perpendicularly to the plane of the layer; whereas, according to other embodiments of the present invention, step (b) comprises forming at least one granular magnetic recording layer for a perpendicular-type medium, wherein the easy axis of magnetization of the magnetic grains is oriented parallel to the plane of the layer.

According to either embodiment, the non-magnetic material comprises from about 4 to about 12 mol. % of the granular magnetic recording layer; and the non-magnetic material is present predominantly at said grain boundaries.

In accordance with other embodiments according to the invention, the mixture is a binary mixture comprising first and second metal oxides selected from the group consisting $TiO_2$, $Al_2O_3$, $Nb_2O_5$, $SiO_2$, $MoO_3$, $Cr_2O_3$, $Ta_2O_5$, $ZrO_2$, $V_2O_5$, $WO_3$, and $Y_2O_3$; and the mole ratios of the first and second metal oxides range from about 0.99 to about 0.99:0.01.

Embodiments of the invention include those wherein the mole ratio of the first and second metal oxides is 0.50:0.50 and the density of the binary mixture is greater than the average density of the first and second metal oxides and wherein the mole ratio of the first and second metal oxides is 0.50:0.50 and the density of the binary mixture is greater than the density of either of the first and second metal oxides, as when, for example, the first metal oxide is $Nb_2O_5$ and the second metal oxide is $TiO_2$.

According to embodiments of the present invention, step (b) comprises forming said at least one granular magnetic recording layer by means of a process selected from the group consisting of:

(1) sputtering at least one metal oxide-containing target in an inert gas environment or in an atmosphere comprising oxygen or a compound containing oxygen;

(2) reactively sputtering at least one metal-containing target in an atmosphere comprising oxygen or a compound containing oxygen; and (3) sputtering at least one metal-containing target in an inert gas environment and post-treating the thus-formed film or layer in an atmosphere comprising oxygen or a compound containing oxygen.

Further embodiments of the invention include those wherein the at least one granular magnetic recording layer comprises a CoPt-based ferromagnetic material contains at least about 12 at. % Pt and up to about 16 at. % other element(s).

Another aspect of the present invention is an improved granular magnetic recording medium, comprising:

(a) a non-magnetic substrate; and (b) at least one granular magnetic recording layer overlying the substrate, the at least one granular magnetic recording layer comprising:

(i) at least one ferromagnetic material including magnetic grains with grain boundaries; and (ii) a non-magnetic material for improving segregation of the magnetic grains, the non-magnetic material comprising a mixture of metal oxides.

According to embodiments of the present invention, the medium is a perpendicular-type medium and the easy axis of magnetization of the magnetic grains of the at least one granular magnetic recording layer is oriented perpendicularly to the plane of the layer; whereas, according to other embodiments of the present invention, the medium is a parallel-type medium and the easy axis of magnetization of the magnetic grains of the at least one granular magnetic recording layer is oriented parallel to the plane of the layer According to either embodiment, the non-magnetic material comprises from about 4 to about 12 mol. % of the at least one granular magnetic recording layer; and the non-magnetic material is present predominantly at the grain boundaries.

In accordance with embodiments of the invention, the mixture advantageously is a binary mixture comprising first and second metal oxides selected from the group consisting of: $TiO_2$, $Al_2O_3$, $Nb_2O_5$, $SiO_2$, $MoO_3$, $Cr_2O_3$, $Ta_2O_5$, $ZrO_2$, $V_2O_5$, $WO_3$, and $Y_2O_3$; and the mole ratios of the first and second metal oxides range from about 0.01:0.99 to about 0.99:0.01.

According to particular embodiments of the invention, the mole ratio of the first and second metal oxides is 0.50:0.50 and the density of the binary mixture is greater than the average density of the first and second metal oxides; whereas, according to further particular embodiments, the mole ratio of the first and second metal oxides is 0.50:0.50 and the density of the binary mixture is greater than the density of either of the first and second metal oxides sputtered under similar conditions, e.g., as when the first metal oxide is $Nb_2O_5$ and the second metal oxide is $TiO_2$.

Further particular embodiments of the invention include those wherein the at least one granular magnetic recording layer comprises a CoPt-based ferromagnetic material containing at least about 12 at. % Pt and up to about 16 at. % other element(s).

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

The present invention addresses and solves problems, disadvantages, and drawbacks associated with poor grain segregation and corrosion and environmental resistance of granular magnetic recording media fabricated according to the conventional methodologies, and is based upon investigations which have determined that an underlying cause of the aforementioned shortcomings and disadvantages of the conventional methodologies for formation of such granular recording media (e.g., poor corrosion resistance) is the porous structure of the as-deposited magnetic recording layer due to (1) high roughness induced by the underlayer structure and (2) the high pressure deposition process.

According to embodiments of the present invention, the conventional non-magnetic oxide material utilized for grain segregation of granular magnetic recording layers is replaced with a non-magnetic oxide mixture of increased density, hence less porosity, vis-à-vis the conventional material. Further, the oxide mixture of the present invention is capable of disrupting any bonding between the magnetic grains. Therefore, as a consequence of the aforementioned properties, the oxide mixture according to the invention serves as an improved segregation material for granular magnetic recording media and significantly reduces the magnetic exchange coupling between adjacent grains, resulting in much reduced noise during reading and writing processes and providing a higher signal-to-noise ratio (SNR).

In addition, the higher density oxide mixture acting as segregation material is predominantly located at the grain boundaries. Therefore, the resultant higher density grain boundaries advantageously serve as an improved barrier to the entry or penetration of corrosive agents, thereby reducing degradation of media performance parameters as well as mechanical properties and resulting in more robust media suitable for use in recording devices with improved reliability.

Figure 1:
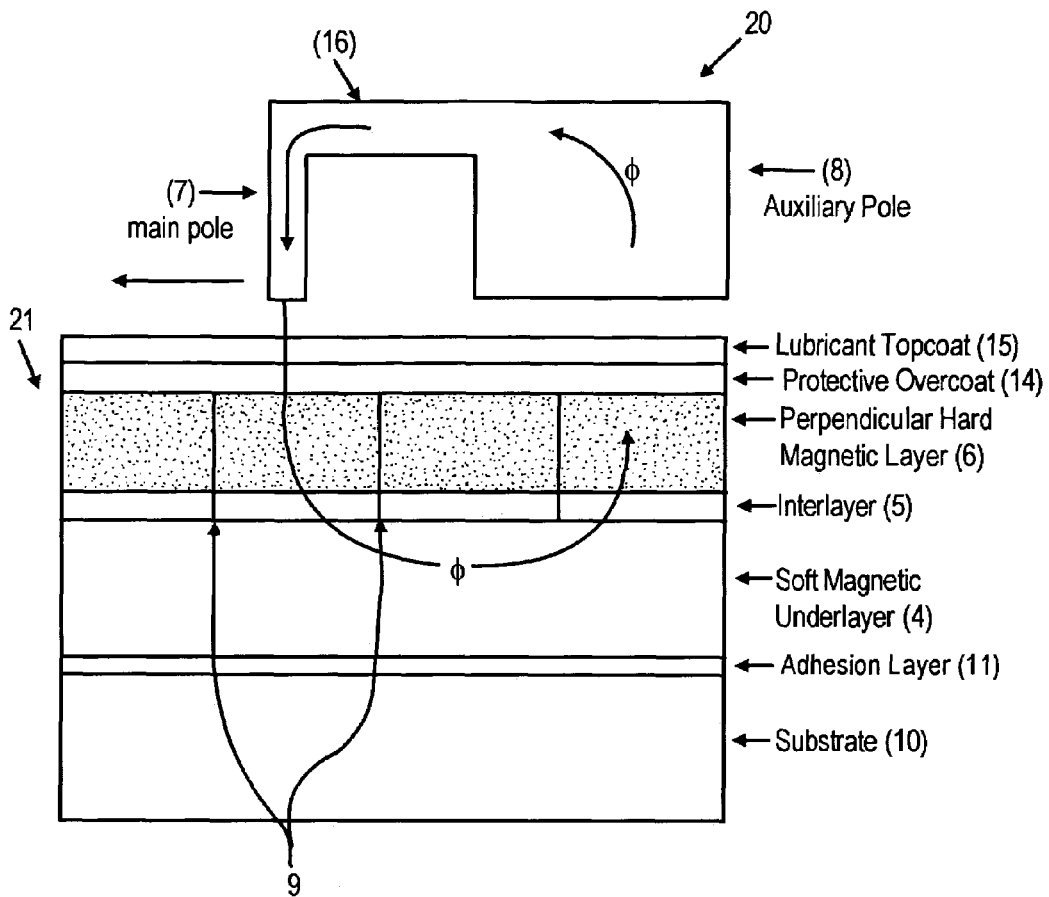
FIG. 1 schematically illustrates, in simplified cross-sectional view, a portion of a magnetic recording, storage, and retrieval system according to the conventional art, comprised of a perpendicular magnetic recording medium and a single pole transducer head.
Figure 2:
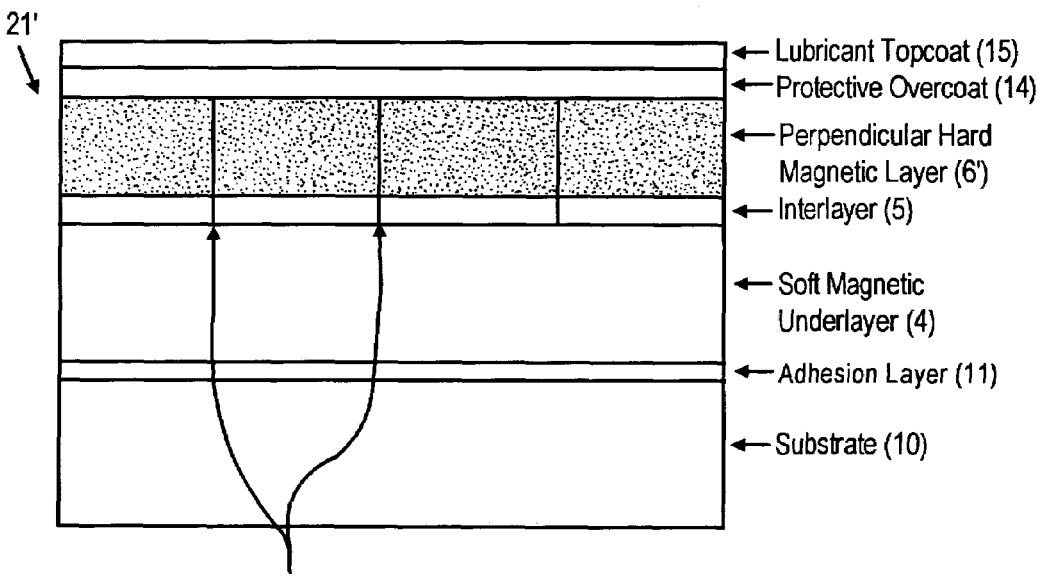
FIG. 2 schematically illustrates, in simplified cross-sectional view, a portion of an improved perpendicular magnetic recording medium according to the present invention.

Referring to FIG. 2, shown therein, in simplified cross-sectional view, a portion of an improved granular perpendicular magnetic recording medium 21' according to an illustrative, but non-limitative, embodiment of the present invention, adapted for use in a single-pole system such as illustrated in FIG. 1. More specifically, granular perpendicular recording medium 21' resembles the conventional granular perpendicular magnetic recording medium 21 of FIG. 1 and comprises a series of thin-film layers arranged in an overlying (stacked) sequence. As before, reference numerals 10, 11, 4, 5, and 6', respectively, indicate a non-magnetic substrate, an optional adhesion layer, a soft magnetic underlayer, at least one non-magnetic seed or interlayer (sometimes referred to as an "intermediate" layer), and at least one magnetically hard granular perpendicular recording layer with its magnetic easy axis perpendicular to the film plane. Typically, the various underlayers should establish a high surface roughness in order to induce grain separation in the magnetic recording layer.

The relatively thin interlayer 5, comprised of one or more layers of non-magnetic materials, serves to: (1) prevent magnetic interaction between the soft underlayer 4 and the at least one magnetically hard granular perpendicular recording layer 6'; (2) promote desired microstructural and magnetic properties of the at least one magnetically hard granular perpendicular recording layer 6', e.g., by serving to establish a crystallographically oriented base layer for inducing growth of a desired plane in the overlying magnetically hard granular perpendicular recording film or layer 6' (e.g., a <0002> hcp plane); and (3) establish a high surface roughness in order to induce grain separation in the magnetically hard recording layer.

With continued reference to FIG. 2, vertical lines 9 indicate grain boundaries of polycrystalline layers 5 and 6' of the layer stack constituting medium 21'. Magnetically hard main recording layer 6' is formed on interlayer 5, and while the grains of each polycrystalline layer may be of differing widths (as measured in a horizontal direction) represented by a grain size distribution, they are generally in vertical registry (i.e., vertically "correlated" or aligned).

Completing the layer stack is a protective overcoat layer 14, such as of a diamond-like carbon (DLC), formed over hard magnetic layer 6', and a lubricant topcoat layer 15, such as of a perfluoropolyethylene material, formed over the protective overcoat layer.

Substrate 10 is typically disk-shaped and comprised of a non-magnetic metal or alloy, e.g., Al or an Al-based alloy, such as Al—Mg having an Ni—P plating layer on the deposition surface thereof, or alternatively substrate 10 is comprised of a suitable glass, ceramic, glass-ceramic, polymeric material, or a composite or laminate of these materials. Optional adhesion layer 11, if present, may comprise an up to about 100 Å thick layer of a material such as Ti, a Ti-based alloy, Cr, or a Cr-based alloy. Soft magnetic underlayer 4 typically comprises an about 500 to about 4,000 Å thick layer of a soft magnetic material selected from the group consisting of Ni, NiFe (Permalloy), Co, CoZr, CoZrCr, CoZrNb, CoFeZrNb, CoFe, Fe, FeN, FeSiAl, FeSiAlN, FeCoB, FeCoC, etc. Interlayer 5 typically comprises an up to about 300 Å thick layer or layers of non-magnetic material(s), such as Ru, TiCr, Ru/CoCr$_{37}$Pt$_6$, RuCr/CoCrPt, etc.; and the at least one magnetically hard granular perpendicular recording layer 6' typically comprises an about 50 to about 250 Å thick layer(s) of Co-based alloy(s) including one or more elements selected from the group consisting of Cr, Fe, Ta, Ni, Mo, Pt, V, Nb, Ge, B, and Pd, e.g., a CoPt-based ferromagnetic material containing at least about 12 at. % Pt and up to about 16 at. % other element(s) such as enumerated above.

According to embodiments of the present invention, granular perpendicular hard magnetic recording layer 6' includes at least one of the abovementioned Co-based ferromagnetic materials including magnetic grains with grain boundaries between adjacent grains, and a non-magnetic material for improving segregation of the magnetic grains, the non-magnetic material comprising a high density, low porosity mixture of metal oxides.

Referring to Table I below, shown therein are film densities (gm/cc) of a number of individual metal oxides, as well as of several two-component (i.e., binary) mixtures of the metal oxides composed of 50 mol. % of each oxide. Each film was formed by DC magnetron sputtering of the metallic element in an Ar/O$_2$ gas atmosphere, wherein the O$_2$ content was adjusted to provide stoichiometric films. For each of the individual metal oxides, the measured densities were slightly less than the theoretical density under high pressure deposition.

TABLE I

| Oxide | Film Density (gm/cc) |
| --- | --- |
| SiO$_2$ | 2.22 |
| TiO$_2$ | 3.24 |
| Nb$_2$O$_5$ | 3.60 |
| Al$_2$O$_3$ | 2.60 |
| SiO$_2$ + TiO$_2$ | 2.81 |
| Al$_2$O$_3$ + TiO$_2$ | 3.01 |
| Nb$_2$O$_5$ + TiO$_2$ | 4.06 |

As may be evident from the data of Table I, the film density (d) of a first class or type of oxide mixtures composed of OX$_A$ and OX$_B$, i.e., SiO$_2$+TiO$_2$ and Al$_2$O$_3$+TiO$_2$, is such that $d_{(OxA \times OxB)} > (d_{OxA}+d_{OxB})/2$. Stated differently, the density of the 50:50 binary mixture is greater than the average of the densities of the component oxides.

For a second class or type of oxide mixtures composed of Ox$_A$ and Ox$_B$, i.e., Nb$_2$O$_5$+TiO$_2$, a synergistic increase in the resultant film density (d) of the mixture is observed, i.e., $d_{(OxA \times OxB)} > d_{OxA}$ or $d_{OxB}$. Stated differently, the density of the 50:50 binary mixture is greater than the densities of either of the component oxides.

While not desirous of being bound by any particular theory, it is nonetheless believed that the synergistic effect on density of the Nb$_2$O$_5$+TiO$_2$ mixture may indicate possible hybridization of the outer electron shells of the two metal elements through the oxygen 2$p$ orbital, thereby favoring an optimized lattice distance or spacing, resulting in a much denser atomic packing.

In either instance, the reduced porosity, dense oxide mixtures of the invention provide granular magnetic recording layers with improved grain segregation and corrosion resistance vis-à-vis conventional granular magnetic recording layers.

According to the invention, the mixture of non-magnetic oxides preferably comprises from about 4 to about 12 mol. % of the granular magnetic recording layer; and the non-magnetic material should not be uniformly distributed throughout the magnetic film but rather is present predominantly at the grain boundaries.

The mixture of oxides according to embodiments of the invention may be, but is not limited to, a binary mixture comprising first and second metal oxides such as metal oxides selected from the group consisting of: TiO$_2$, Al$_2$O$_3$, Nb$_2$O$_5$, SiO$_2$, MoO$_3$, Cr$_2$O$_3$, Ta$_2$O$_5$, ZrO$_2$, V$_2$O$_5$, WO$_3$, and Y$_2$O$_3$; and the mole ratios of the first and second metal oxides are not limited to 0.50:0.50 but may range from about 0.01:0.99 to about 0.99:0.01.

Illustrative of the versatility of the present invention is the flexibility in selection of technique for forming the granular magnetic recording layer with oxide mixture for enhanced grain segregation and increased corrosion resistance. For example, the granular magnetic recording layer may be formed by means of a process selected from the group consisting of:

(1) sputtering at least one metal oxide-containing target in an inert gas environment or in an atmosphere comprising oxygen or a compound containing oxygen;

(2) reactively sputtering at least one metal-containing target in an atmosphere comprising oxygen or a compound containing oxygen (e.g., a CoPt-XY target, wherein X and Y represent first and second metals) to form the mixed oxide materials in the grain boundaries; and (3) sputtering at least one metal-containing target in an inert gas environment and post-treating the thus-formed film or layer in an atmosphere comprising oxygen or a compound containing oxygen.

In each instance, DC magnetron or RF sputtering (static or pass-by type) may be utilized. Further, the inventive methodology is not limited to formation of granular perpendicular magnetic recording layers but rather may be utilized for forming granular magnetic recording layers for longitudinal-type recording media; and the media design may include a single granular magnetic recording layer fabricated according to the principles of the present invention, or may comprise multiple granular magnetic recording layers or a laminated structure with thin non-magnetic spacer layers between adjacent granular magnetic recording layers.

It should be noted that the above-described embodiments of the inventive methodology and media are merely illustrative, and not limitative, of the advantageous results afforded by the present invention. Specifically, the inventive methodology and media are not limited to use of CoPt alloys with the illustrated oxide mixtures, such as $SiO_2+TiO_2$, $Al_2O_3+TiO_2$, and $Nb_2O_5+TiO_2$, but rather is useful in providing enhanced grain segregation and corrosion resistance of recording media comprising all manner of granular longitudinal and perpendicular magnetic recording layers.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A granular magnetic recording medium comprising:
   (a) a non-magnetic substrate; and
   (b) at least one granular magnetic recording layer overlying said substrate, said at least one granular magnetic recording layer comprising:
   (i) at least one ferromagnetic material including magnetic grains with grain boundaries; and
   (ii) a non-magnetic material for improving segregation of said magnetic grains, said non-magnetic material comprising a mixture of metal oxides,
   wherein said mixture is a binary mixture comprising first and second metal oxides selected from the group consisting of: $TiO_2$, $Al_2O_3$, $Nb_2O_5$, $SiO_2$, $MoO_3$, $Cr_2O_3$, $Ta_2O_5$, $ZrO_2$, $V_2O_5$, $WO_3$, and $Y_2O_3$,
   the mole ratio of the first metal oxide and the second metal oxide is about 0.50:0.50, and
   a density of said binary mixture is greater than a density of either of the first metal oxide and the second metal oxide.

2. The medium as in claim 1, wherein:
said medium is a perpendicular-type medium and the easy axis of magnetization of said magnetic grains of said at least one granular magnetic recording layer is oriented perpendicularly to the plane of said layer.

3. The medium as in claim 1, wherein:
said medium is a parallel-type medium and the easy axis of magnetization of said magnetic grains of said at least one granular magnetic recording layer is oriented parallel to the plane of said layer.

4. The medium as in claim 1, wherein:
said non-magnetic material comprises from about 4 to about 12 mol. % of said at least one granular magnetic recording layer.

5. The medium as in claim 4, wherein:
said non-magnetic material is present predominantly at said grain boundaries.

6. The medium as in claim 1, wherein:
said first metal oxide is $Nb_2O_5$, said second metal oxide is $TiO_2$, and said at least one granular magnetic recording layer comprises a CoPt-based ferromagnetic material containing at least about 12 at. % Pt and up to about 10 at. % other element(s).

7. The medium as in claim 1, wherein the non-magnetic material is present predominantly at the grain boundaries.

8. The medium as in claim 1, wherein
a density of the binary mixture is greater than an average density of the first metal oxide and the second metal oxide.

9. A granular magnetic recording medium, comprising:
(a) a non-magnetic substrate; and
(b) at least one granular magnetic recording layer overlying said substrate, said at least one granular magnetic recording layer comprising:
(i) at least one ferromagnetic material including magnetic grains with grain boundaries; and
(ii) a non-magnetic material for improving segregation of said magnetic grains, said non-magnetic material comprising a mixture of metal oxides,
wherein said mixture is a binary mixture comprising first and second metal oxides selected from the group consisting of: $Nb_2O_5$, $MoO_3$, $Cr_2O_3$, $WO_3$, and $Y_2O_3$,
the mole ratio of said first and second metal oxides is 0.50:0.50, and
the density of said binary mixture is greater than the average density of said first and second metal oxides.

10. A granular magnetic recording medium, comprising:
a non-magnetic substrate; and
at least one granular magnetic recording layer overlying the substrate having at least one ferromagnetic material including magnetic grains with grain boundaries,
wherein the medium is a perpendicular-type medium, and
an easy axis of magnetization of the magnetic grains of the at least one granular magnetic recording layer is oriented perpendicularly to the plane of the at least one granular magnetic layer, and
the at least one granular magnetic recording layer overlying the substrate further comprises:
a non-magnetic material for improving segregation of the magnetic grains, the non-magnetic material comprising a binary mixture comprising first and second metal oxides, and is about 4 to about 12 mol.% of the at least one granular magnetic recording layer,
the mole ratio of the first metal oxide to the second metal oxide ranges from about 0.01:0.99 to about 0.99:0.01,
the first metal oxide is $Nb_2O_5$,
the second metal oxide is TiO2, and
the at least one granular magnetic recording layer comprises a CoPt-based ferromagnetic material containing at least about 12 at. % Pt and up to about 10 at. % other element(s).

11. The medium as in claim 10, wherein the non-magnetic material is present predominantly at the grain boundaries.

12. A granular magnetic recording medium, comprising:
a non-magnetic substrate; and
at least one granular magnetic recording layer overlying the substrate having at least one ferromagnetic material including magnetic grains with grain boundaries,
wherein the medium is a parallel-type medium,
an easy axis of magnetization of the magnetic grains of the at least one granular magnetic recording layer is oriented parallel to the plane of the layer, and
the at least one granular magnetic recording layer overlying the substrate further comprises:
  a non-magnetic material for improving segregation of the magnetic grains, the non-magnetic material comprising a mixture of metal oxides, and is about 4 to about 12 mol.% of the at least one granular magnetic recording layer,
  the mixture is a binary mixture comprising first and second metal oxides selected from the group consisting of: $Nb_2O_5$, $MoO_3$, $Cr_2O_3$, $WO_3$, and $Y_2O_3$,
  the mole ratio of the first metal oxide to the second metal oxide is about 0.50:0.50, and
  a density of the binary mixture is greater than an average density of the first metal oxide and the second metal oxide.

13. A granular magnetic recording medium, comprising:
a non-magnetic substrate; and
at least one granular magnetic recording layer overlying the substrate having at least one ferromagnetic material including magnetic grains with grain boundaries,
wherein the medium is a parallel-type medium,
an easy axis of magnetization of the magnetic grains of the at least one granular magnetic recording layer is oriented parallel to the plane of the layer, and
the at least one granular magnetic recording layer overlying the substrate further comprises:
  a non-magnetic material for improving segregation of the magnetic grains, the non-magnetic material comprising a binary mixture comprising first and second metal oxides, and is about 4 to about 12 mol.% of the at least one granular magnetic recording layer,
the first metal oxide is $Nb_2O_5$,
the second metal oxide is $TiO_2$, and
the at least one granular magnetic recording layer comprises a CoPt-based ferromagnetic material containing at least about 12 at. % Pt and up to about 10 at. % other element(s).

* * * * *